(12) United States Patent
Isquierdo et al.

(10) Patent No.: US 9,227,513 B2
(45) Date of Patent: Jan. 5, 2016

(54) CONTROL UNIT INTEGRATING A DEVICE FOR ASSISTING ASSEMBLY

(75) Inventors: Vincent Isquierdo, Plobsheim (FR); Sebastien Trappler, Eschau (FR)

(73) Assignee: Delphi Technologies, Inc., Troy, MI (US)

( * ) Notice: Subject to any disclaimer, the term of this patent is extended or adjusted under 35 U.S.C. 154(b) by 125 days.

(21) Appl. No.: 14/344,630

(22) PCT Filed: Aug. 30, 2012

(86) PCT No.: PCT/EP2012/066886
§ 371 (c)(1),
(2), (4) Date: Mar. 13, 2014

(87) PCT Pub. No.: WO2013/037644
PCT Pub. Date: Mar. 21, 2013

(65) Prior Publication Data
US 2014/0347796 A1    Nov. 27, 2014

(30) Foreign Application Priority Data
Sep. 13, 2011    (FR) ...................................... 11 58109

(51) Int. Cl.
*G06F 1/16*    (2006.01)
*H05K 5/00*    (2006.01)
(Continued)

(52) U.S. Cl.
CPC ................. *B60K 37/06* (2013.01); *B60K 35/00* (2013.01); *B60K 37/04* (2013.01);
(Continued)

(58) Field of Classification Search
CPC ................. G06F 1/16; G06F 1/1601–1/1611; G06F 1/1613–1/1698; G06F 1/18–1/189; H05K 5/00–5/069; H05K 7/00–7/186; G11C 5/00; G11C 4/04

USPC ......... 361/756, 741, 725, 787, 789, 794, 686, 361/687, 688, 696, 697, 701–703, 709, 361/807–810; 348/787, 789, 794; 349/58–60

See application file for complete search history.

(56) References Cited

U.S. PATENT DOCUMENTS

| 5,873,749 A | 2/1999 | Takiguchi et al. |
| 6,104,616 A * | 8/2000 | Benson, Jr. .......... H05K 7/1461 312/223.2 |

(Continued)

FOREIGN PATENT DOCUMENTS

| DE | 196 54 637 A1 | 7/1997 |
| WO | 03/095320 A1 | 11/2003 |

OTHER PUBLICATIONS

International Search Report dated Oct. 1, 2012.

*Primary Examiner* — Anthony Haughton
*Assistant Examiner* — Razmeen Gafur
(74) *Attorney, Agent, or Firm* — Lawrence D. Hazelton

(57) ABSTRACT

The invention relates to a control unit that includes a case able to receive a first device which may in particular be a printed circuit, a fascia intended to be placed against the case, the fascia being able to receive a second device which may in particular be a force sensor, a connection link connecting the first device to the second device. The control unit is in addition provided with an integrated device for assisting assembly keeping the control unit in an open state (EO), the case and the fascia being at a distance one from the other in a first position (P1) and this so as to facilitate inter alia the assembly of the connection link, the integrated device for assisting assembly then permitting placing of the control unit in a closed state (EF), the fascia and the case having been brought one towards the other and being one against the other.

8 Claims, 3 Drawing Sheets

(51) Int. Cl.
*B60K 37/06* (2006.01)
*B60K 35/00* (2006.01)
*B60K 37/04* (2006.01)
*B60R 11/02* (2006.01)
*E05D 7/10* (2006.01)
*E05D 11/06* (2006.01)
*B62D 25/14* (2006.01)
*H05K 5/02* (2006.01)
*G06F 1/18* (2006.01)
*H05K 7/00* (2006.01)
*B60R 11/00* (2006.01)
*E05D 5/10* (2006.01)

(52) U.S. Cl.
CPC ........... *B60R 11/0235* (2013.01); *B62D 25/14* (2013.01); *E05D 7/1066* (2013.01); *E05D 11/06* (2013.01); *H05K 5/0073* (2013.01); *H05K 5/0226* (2013.01); *B60K 2350/925* (2013.01); *B60K 2350/941* (2013.01); *B60R 2011/0094* (2013.01); *B60Y 2304/01* (2013.01); *B60Y 2304/074* (2013.01); *B60Y 2410/113* (2013.01); *B60Y 2410/115* (2013.01); *E05D 2005/106* (2013.01); *E05Y 2900/538* (2013.01)

(56) References Cited

U.S. PATENT DOCUMENTS

| | | | | |
|---|---|---|---|---|
| 6,123,565 A * | 9/2000 | Bierek | ................ | B60R 16/0239 361/756 |
| 6,186,357 B1 | 2/2001 | Kyle | | |
| 8,315,040 B2 * | 11/2012 | Roberts | ................ | A63H 17/262 361/622 |
| 8,467,839 B2 * | 6/2013 | Rema Shanmugam | ....... | H04M 1/0237 361/679.3 |
| 8,811,024 B2 * | 8/2014 | Wei | .......... | G06F 1/169 361/679.18 |
| 8,873,243 B2 * | 10/2014 | Sano | .................... | H05K 5/0004 206/706 |
| 2002/0071104 A1 * | 6/2002 | Silverbrook | ................ | B41J 2/14 355/18 |
| 2006/0060732 A1 | 3/2006 | Tannas | | |
| 2008/0030951 A1 * | 2/2008 | Hall | .................... | H05K 7/20918 361/696 |
| 2008/0037211 A1 * | 2/2008 | Martin | ................. | G11B 33/122 361/696 |
| 2008/0239657 A1 * | 10/2008 | Oyama | ................... | G06F 1/183 361/679.37 |
| 2009/0021897 A1 * | 1/2009 | Katzenberger | ...... | H01M 2/1022 361/679.31 |
| 2009/0225514 A1 * | 9/2009 | Correa | ............... | H05K 7/20781 361/701 |
| 2009/0257198 A1 * | 10/2009 | Rogers | .................... | H05K 5/023 361/726 |
| 2010/0046157 A1 * | 2/2010 | Wang | ................... | G11B 33/025 361/679.32 |
| 2011/0164388 A1 * | 7/2011 | Ozaki | ................. | B60R 11/0235 361/725 |
| 2011/0193617 A1 * | 8/2011 | Yoshimoto | ........... | G06K 7/0021 327/518 |
| 2012/0026674 A1 * | 2/2012 | Aldridge | ................ | G06F 1/187 361/679.33 |
| 2012/0118601 A1 * | 5/2012 | Hite | ..................... | H05K 5/0017 174/50 |
| 2013/0058051 A1 * | 3/2013 | Casey | .................. | H05K 7/1432 361/730 |
| 2013/0100620 A1 * | 4/2013 | Christoph | ........... | B60R 16/0239 361/752 |
| 2013/0265221 A1 * | 10/2013 | Lee | .......................... | G06F 3/01 345/156 |

* cited by examiner

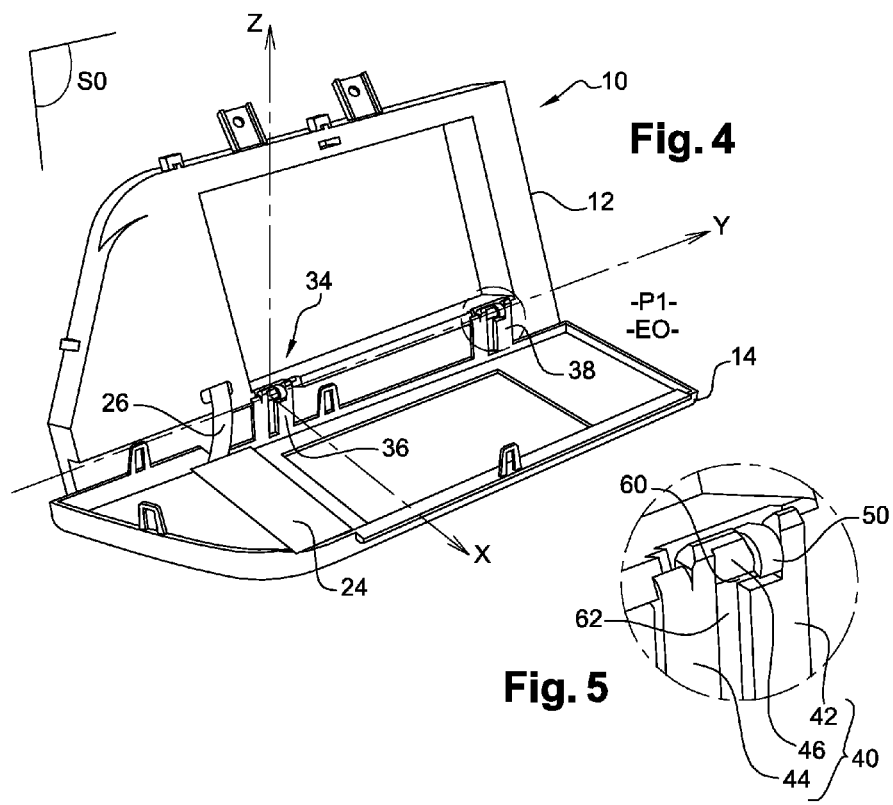
Fig. 4
Fig. 5
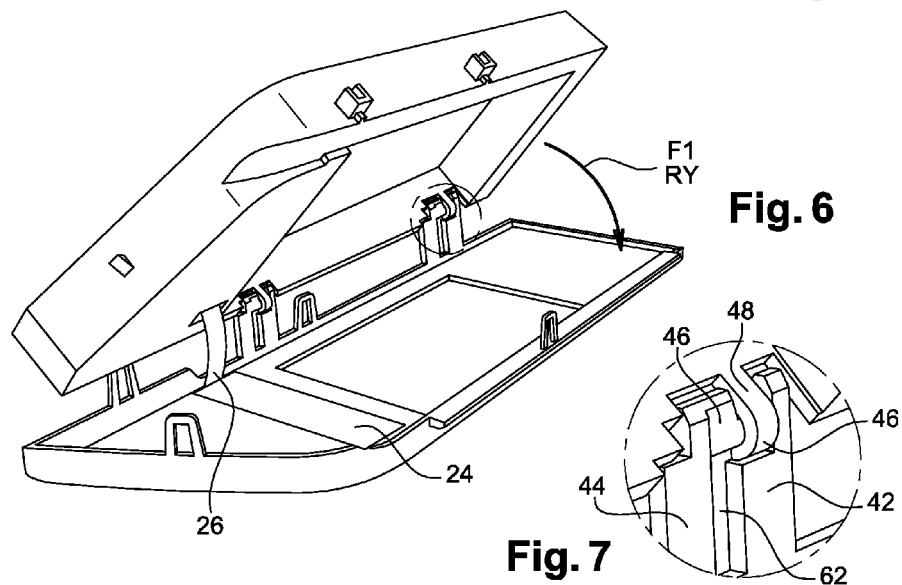
Fig. 6
Fig. 7

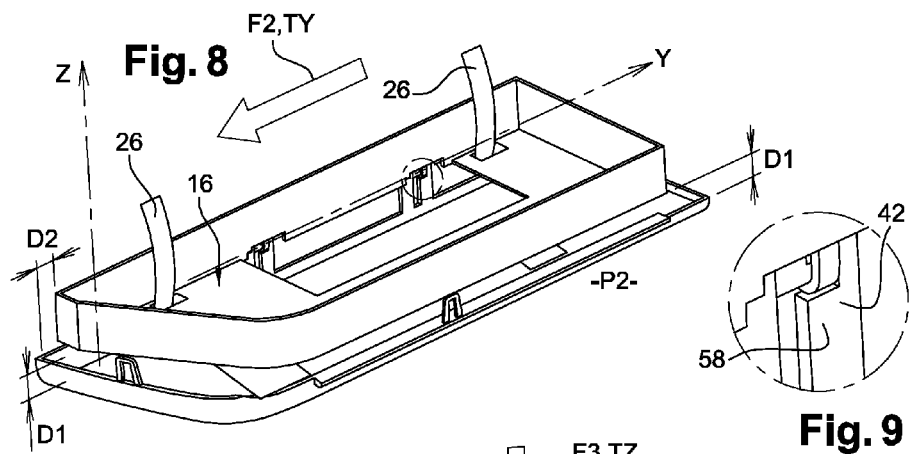
Fig. 8
Fig. 9
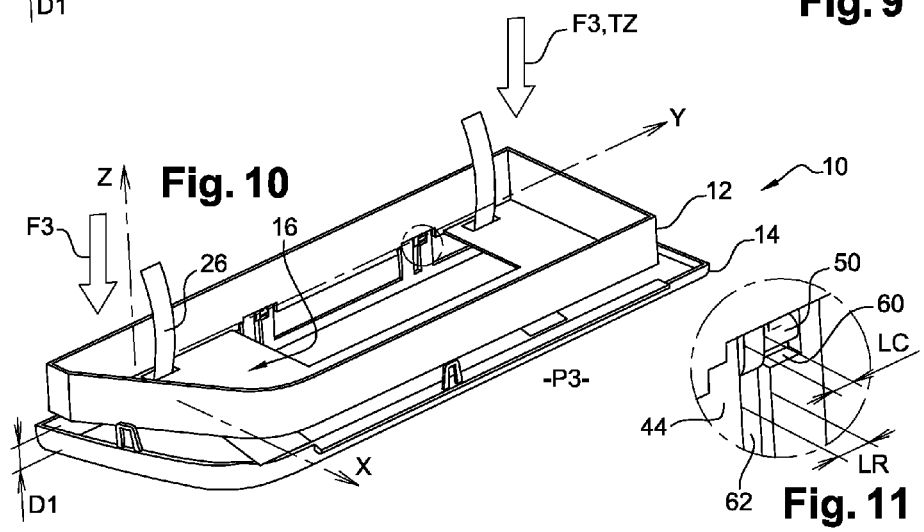
Fig. 10
Fig. 11
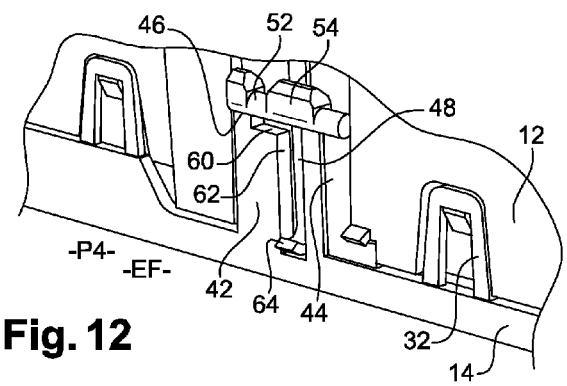
Fig. 12

CONTROL UNIT INTEGRATING A DEVICE FOR ASSISTING ASSEMBLY

CROSS-REFERENCE TO RELATED APPLICATION

This application claims the benefit under 35 U.S.C. §371 of published PCT Patent Application Number PCTEP 2012066886, filed Aug. 30, 2012 and claims priority to French Patent Application 1158109 filed Sep. 13, 2011, and published as WO2013037644 on Mar. 21, 2013, the entire contents of which is hereby incorporated by reference herein.

TECHNICAL FIELD OF INVENTION

The invention relates to a control unit which can be integrated in the dashboard of a vehicle, the unit comprising control means permitting the adjustment of various functions in a vehicle. The invention more particularly relates to a device for assisting assembly of the control unit. Lastly the invention also relates to a method for mounting of a control unit comprising an integrated device for assisting assembly.

BACKGROUND OF INVENTION

Motor vehicles have in their dashboard and central console means for controlling many systems such as the air-conditioning, the radio and others. These means which up to now have used electromechanical buttons of rotary knob or sliding cursor type are progressively being replaced by sensory and tactile proximity sensors, zero displacement or very short travel sensors, employing flexible resistive films of the FSR (Force Sensing Resistor) type. These sensors comprise a wide detection zone electrically connected to a printed circuit. The control units are formed of two main parts, a case and a fascia, which must after assembly be proof against water, against dusts and other contaminants. To assist protection of the printed circuit it is placed in an isolated compartment of the case while the flexible film of the sensor is on the fascia under a protective device such as a thin wall and is thus actuatable by a user.

These increasingly numerous control means are integrated into control units which are also increasingly small and the assembly of these units is then increasingly difficult. One of the most difficult operations consists of connecting the flexible film to the integrated circuit. Indeed the two components being fixed for the one in a compartment of the case and for the other to the fascia, an opening is provided in an internal wall of the case so that a connection link in the form of a long and narrow flexible tongue is inserted in it and can enter the compartment to be electrically connected there to the printed circuit. The difficult manipulation of the components during the assembly requires considerable time and can cause damage at the connection link. Moreover the problem is not specific to resistive sensors but to any flexible element having to connect the fascia to the case. Thus can be used optical fibers, conventional electrical cables.

It has become important to propose a simple device facilitating manipulation and ensuring the quality of the mounting of the control units.

SUMMARY OF THE INVENTION

The present invention resolves the problem mentioned above by proposing a control unit.

The invention also proposes a process for assembly of the said control unit.

The invention proposes a control unit comprising a case able to receive a first device which may in particular be a printed circuit, and a fascia intended to be placed against the case, the fascia being able to receive a second device which may in particular be a proximity sensor. A connection link connects the first device to the second device. The control unit is in addition provided with an integrated device for assisting assembly keeping it in an open state, the case and the fascia being at a distance one from the other in a first position. Thus the assembly of the connection link is facilitated. The integrated device for assisting assembly then allows the control unit to be placed in a closed state, the fascia and the case having been brought one towards the other and being one against the other in a complementary engagement of the edge of the case with the periphery of the fascia. The integrated device for assisting assembly allows the fascia and the case to pivot and to translate one relative to the other so as to pass the control unit from the open state to the closed state. The integrated device for assisting assembly is a hinge comprising a crossbar attached to the fascia or to the case, the crossbar comprising a spindle fixed between a first support and a second support. The hinge also comprising an arm attached to the case, to the fascia respectively, the arm terminating in an open hook which can be engaged on the spindle so as to pivot about and slide along the spindle.

The space under the crossbar, between the supports, the spindle and the fascia, the case respectively, left free in order to allow the passage of the hook on passage from the open state to the closed state forms a right-angle having a first slot situated just under the spindle and a second slot extending the first and running along the second support. Moreover, the hook has a width less than the length of the spindle and its engagement on the spindle can only occur at the free end of the first slot, on the side of the first support. In this position the case can only pivot about the spindle between the first open position and a second position in which it is distant, parallel and slightly offset relative to the fascia. The case being in the second position it can be laterally translated towards a third position, so as to be distant, parallel, and just facing the fascia, the hook sliding along the spindle in the first slot until it is level with the second slot. The second slot has a width greater than the width of the hook and, being in the third position, the hook can be disengaged from the spindle and thus translated and brought towards the fascia. The hook can slide in the second slot until the case and the fascia are in contact one with the other, the control unit then being in the closed state.

Moreover, the integrated device for assisting assembly can comprise two hinges, each hinge having a spindle and an arm terminated in a hook, the two spindles being co-axial so as to form a long guidance.

More precisely, the first device is a printed circuit and the second device a sensor comprising a flexible film having a detection zone connected to the printed circuit by a long and narrow flexible tongue. Lastly, the connection link can comprise an optical fibers.

The invention also relates to a method for assembly of a control unit comprising the following steps:

providing a case and a fascia provided for the one with a crossbar supporting a spindle and for the other with an arm terminated in an open hook designed to be engaged on the spindle, providing a device intended to be arranged against the fascia, the device having a link designed to be connected to another device arranged on the case, engaging the hook on the spindle so as to form a hinge linking the case to the fascia, placing the control unit in an open state, the fascia and the case being in a first position, as distant as possible one from the other, arranging the device on the fascia, arranging the connection link (30) from the device (24) to the case, pivoting the fascia, or the case, so as to pass from the first position to a second position in which the case and the fascia are distant, parallel and slightly offset one relative to the other, placing the control unit in a closed state, the case and the fascia being brought towards each other until they are in contact one with the other.

The method can also comprise the following step:

arranging another device in the case, connecting the connection link to the said other device.

BRIEF DESCRIPTION OF DRAWINGS

An embodiment of the invention is now described by means of the following figures.

FIG. 4 is an isometric view of the control unit of FIG. 2 during mounting and placed in a first position.

FIG. 5 is a detail of FIG. 4 presenting the hinge of the control unit engaged.

FIG. 6 is an isometric view of the control unit during closing.

FIG. 7 is a detail of FIG. 6 showing the hinge of the control unit.

FIG. 8 is an isometric view of the control unit during mounting and placed in a second position.

FIG. 9 is a detail of FIG. 8 showing the hinge of the control unit.

FIG. 10 is an isometric view of the control unit during mounting and placed in a third position.

FIG. 11 is a detail of FIG. 10 showing the hinge of the control unit.

FIG. 12 is a detail of the hinge of the control unit once closed.

DETAILED DESCRIPTION

Figure 1:
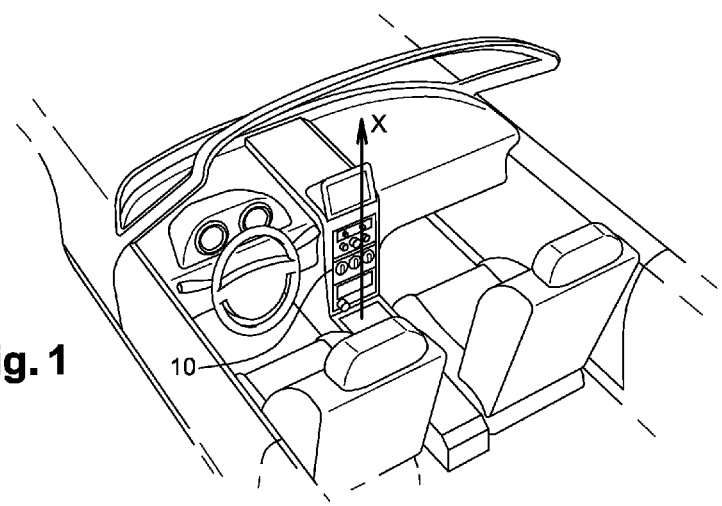
FIG. 1 is an overall view of the inside of the vehicle in which a control unit in accordance with the invention has been placed.

FIG. 1 shows the inside of a convertible vehicle, a control unit 10 in accordance with the invention being integrated in the dashboard of the vehicle so as to be accessible to the driver. In this case the control unit 10 contains the control actuators of the air-conditioning or any other system such as the radio or the navigation system. This representation is in no case limiting to the invention which is independent of the type of environment selected, here a vehicle, and of the type of control operable from the actuators of the control unit.

Figure 2:
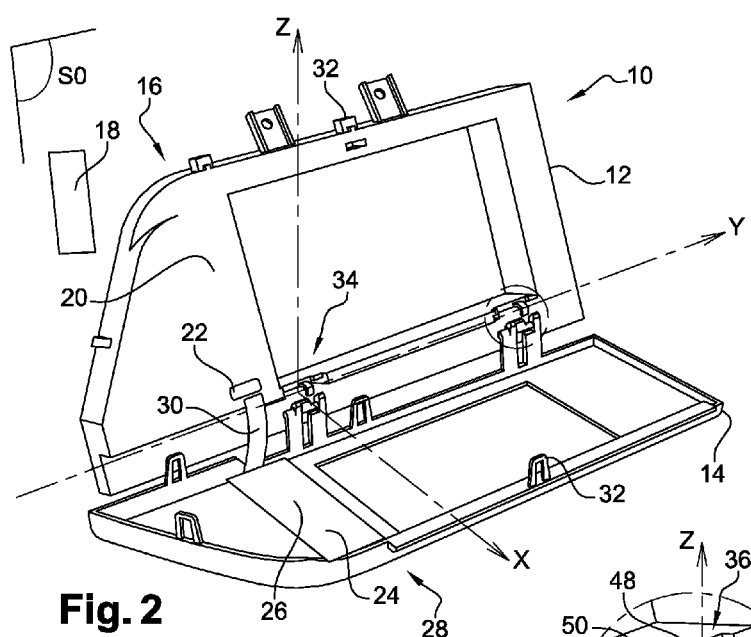
FIG. 2 is an exploded view of the control unit of FIG. 1.

FIG. 2 is an exploded view of the control unit 10 in which the main components are distinguished. The control unit 10 comprises a case 12 intended to be closed by a fascia 14. The control unit 10 can optionally comprise a wide central opening, here shown rectangular allowing the viewing of an information screen. The case 12 has a base surrounded by an edge. It is provided on the sides of the central opening with protected compartments 16 each intended to receive a printed circuit 18. Each compartment 16 is protected from contaminants and foreign bodies, such as water or dust, by a partition 20 internal to the case generally parallel with the bottom of the case 12. A small opening 22 is formed in the internal partition 20. Moreover, the control buttons are zero-displacement touch pressure sensors 24. They comprise a flexible multilayer resistive film 26 the resistance of which decreases under the effect of a slight pressure. Such films are sometimes known by their English designation Force Sensing Resistor (FSR). The resistive sensor 24 comprises a detection zone 28 sufficiently wide for a user to find it easily and actuate the required control. The detection zone 28 is extended by a long and flexible tongue 30 intended to be connected to the printed circuit 18 which provides the electrical supply of the sensor 24. The case 12 and the fascia 14 having to be finally fixed one to the other, the edge of the case 12 and the periphery of the fascia 14 are designed to allow a complementary engagement one with the other. The fixing is provided by complementary male and female clips 32 placed on the edge of the case 12 and on the periphery of the fascia 14.

Figure 3:
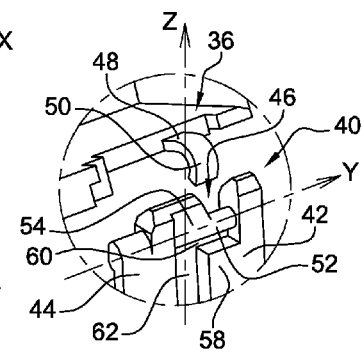
FIG. 3 is a detail of FIG. 2 presenting a hinge of the control unit the elements not being engaged.

To facilitate mounting, the control unit 10 is provided with a device for assisting assembly 34 which allows articulation of the case 12 and the fascia 14 one relative to the other by means of two aligned hinges 36, 38. Each hinge 36, 38 is formed on the one hand of a crossbar 40 comprising two supports 42, 44, supporting a spindle 46 and, on the other hand, of an arm 48 the free end of which is curved in the shape of a hook 50. The hook 50 and the spindle of the crossbar 40 are designed to cooperate and form a hinge 36, 38. FIG. 3 details the elements of the hinge 36, unassembled.

The pieces are referenced in a direct reference frame (X, Y, Z) as shown in the figures. The spindle 46 of the crossbar 40 extends along the axis Y, the plane (X, Y), which for the sake of simplification and without thereby limiting the description will also be called "horizontal plane", corresponding to the plane in which the fascia 14 is placed in FIGS. 2 to 12. The bottom of the case 12 is for its part placed, in FIGS. 2 and 4, in a plane S0 forming an obtuse angle with the horizontal plane.

In the description the crossbar 40 is attached to the fascia 14, extending from it in the vertical plane (Y, Z) perpendicularly to the main plane (X, Y) of the fascia 14. The arm 48 terminated in a hook 50 is for its part attached to the case 12 extending perpendicularly to the main plane of the case 12.

It is obvious that a symmetrical arrangement with the crossbar 40 attached to the case 12 and the arm 48 terminated in a hook 50 attached to the fascia 14 is possible.

FIG. 4 shows the control unit 10, the elements presented above being linked the ones to the others. The hooks 50 cooperate with the spindles 46 so that the case 12 and the fascia 14 are articulated and are placed in a first position P1 corresponding to an open state EO of the control unit 10. More easily observable in the detail of FIGS. 3 and 5, the spindle 46 comprises a first cylindrical section 52 in the proximity of the first support 42 around which the hook 50 can be engaged. The spindle 46 continues in a second section 54 wider than the first section 52 and extending to a second support 44. The widening of the second section 54 relatively to the first section 52 of the spindle 46 retains the diameter of the first section 52 and extends above the crossbar 40 so that in the open state EO, the hook 50 being engaged around the first section 52 of the spindle is kept there by the widening of the second section 54. The first support 42 also comprises a widening 58 extending under the crossbar 40 from the foot of the support to under the spindle 46. Indeed, under the crossbar 40, the space left free takes the form of two perpendicular slots 60, 62. The first slot 60 is situated just under the spindle 46 extending along the axis Y and the second slot 62 runs along the second support 44 along the axis Z. In the first position P1, the hook 50 is engaged around the first section of the spindle 52, the free end 64 of the hook engaging under the spindle 46 in the first slot 60. In this position it is easy for an operator to proceed with the difficult mounting operations such as the arrangement of the sensor 24 and the passage of the flexible tongue 30 through the small opening 22 of the internal partition 20 so as to cause it to enter the compartment 16 for the electrical connection with the printed circuit 18. The hinge 36 keeps the case 12 and the fascia 14 at a distance one from the other and forms the device for assisting assembly 34 of the control unit 10.

As mentioned above, the device for assisting assembly 34 thus formed can be used when difficult operations must be performed in a small space, such as that of the control unit 10. The flexible tongue 30 of the resistive film 26 can be depending on the circumstances a fine electrical cable or an optical fibers or any other connection link.

FIG. 6 shows the control unit 10 in an intermediate position during closure after the completion of the difficult mounting operations. The case 12 and the fascia 14 are closed one towards the other by rotation RY about the axis Y, in the direction of the curved arrow F1 of FIG. 5. The hook 50 turns about the first section of the spindle 52 as detailed in FIG. 6, the free end 64 of the hook being engaged under the spindle 46 in the first slot 60.

FIG. 9 shows the control unit 10 in a second position P2 attained on completion of the rotation RY described above. The case 12 and the fascia 14 are parallel one with the other. However they remain at a distance D1 one from the other, the distance D1 being measured along the axis Z, and slightly offset D2 along the axis Y. The hook 50 is still engaged around the first section of the spindle 52, as detailed in FIG. 8, and the rotation RY from the first position P1 towards the second position P2 has largely engaged it under the spindle 46 in the first slot 60. However the hook 50 which was until now kept around the first section 52 of the spindle 46 by the widening of the second section 54 of the spindle and which could only turn about this first section 52 can now translate along the axis Y in the first slot 60, in a translation TY, in the direction of the arrow F2 of FIG. 7, from the first section 52 of the spindle towards the second section 54 of the spindle 46.

FIG. 10 shows the control unit 10 in a third position P3 attained after the hook 50 has translated TY horizontally along the axis Y from the first section 52 to the second section 54 of the spindle. The case 12 and the fascia 14 are still in parallel horizontal planes and still at a distance D1 one from the other but are now one facing the other, the preceding offset D2 having been closed by the translation TY of the passage from the second P2 to the third P3 position. FIG. 10 details the configuration of the hinge 36, in the third position P3. The hook 50 has slid along the spindle 46 from the first section 52 to the second section 54 of the spindle 46 and is placed against the second support 44. In this place the first slot 60 meets the second slot 62 which runs along the second support 44 all along the latter. The second slot 62 has a width LR slightly greater than the width LC of the hook 50 so that, as indicated by the arrows F3 of FIG. 10, the case 12 and the fascia 14 can be brought one towards the other by vertical translation TZ of the case 12. The hook 50 then disengages from the spindle 46 and can slide in the second slot 62.

A fourth and last closed position P4 is simply detailed in FIG. 12 in which, seen at a different angle from that of the preceding figures, the hook 50 has slid in the second slot 62 so that the edge of the case 12 and the periphery of the fascia 14 are in complementary contact one with the other. The male and female clips 32 are then engaged so as to fix the pieces and permanently close the control unit 10.

Alternatively to the closure by clips, other means such as systems with screws, rivets or even glued fixing are possible.

The preceding description details a hinge 36. A preferred embodiment comprises two similar hinges 36, 38, the spindles of which are aligned so as to provide better stability during mounting manipulations. Alternatively, the integrated device for assisting assembly 34 of the control unit 10 could only comprise a single long spindle 46 having a plurality of sections and a plurality of hooks 50 cooperating with the different sections of the same spindle 46. It is also possible to have only a single hinge 36 of large width so as to provide the necessary stability by itself. Moreover, a control unit 10 can comprise one or more sensors 24 each being connected to a printed circuit 18 and the case 12 can comprise a plurality of compartments 16.

The control unit 10 described comprises a force sensor 24 connected via a flexible tongue 30. Alternatively, and without influence on the invention of the device for assisting assembly 34, the tongue 30 can be replaced for example by an electrical cable or by an optical fibers connecting a light source situated in the case 12 to a display attached to the fascia 14. Lastly such a hinge 36, the object of the invention, can be used for any device in which two pieces must be kept in an open position before being closed one towards the other. In the present case the control unit 10 is intended to be closed, but the hinge 36 of the invention can assist in the case of devices having to be regularly manipulated and opened and then closed such as for maintenance and upkeep operations.

The invention claimed is:

1. A control unit comprising:
 a case configured to receive a printed circuit;
 a fascia configured to be placed against the case, the fascia configured to receive a force sensor; and
 a connection link connecting the first device to the second device, wherein
 the control unit is in addition provided with an integrated device for assisting assembly keeping the control unit in an open state, the case and the fascia being at a distance one from the other in a first position and this so as to facilitate inter alia the assembly of the connection link, the integrated device for assisting assembly then allowing the control unit to be placed in a closed state, the fascia and the case being brought one towards the other and being one against the other and in which,
 the integrated device for assisting assembly is a hinge comprising a crossbar attached to the fascia, to the case respectively, the crossbar comprising a spindle fixed between a first support and a second support, the hinge also comprising an arm attached to the case, the fascia respectively, the arm terminating in an open hook which can be engaged on the spindle so as to pivot about and slide along the spindle and in which,
 the space under the crossbar, between the supports, the spindle and the fascia, the case respectively, left free in order to allow the passage of the hook on passage from the open state to the closed state forms a right-angle having a first slot situated just under the spindle and a second slot extending the first and running along the second support.

2. The control unit as described in claim 1, wherein the integrated device for assisting assembly allows the fascia and the case to pivot and to translate one relative to the other so as to cause the control unit to pass from the open state to the closed state.

3. The control unit as described in claim 1, wherein the hook has a width less than the length of the spindle and the engagement of the hook on the spindle can only be effected at the free end of the first slot, on the side of the first support, in which position the case can only pivot about the spindle between the first open position and a second position in which it is distant, parallel and slightly offset relative to the fascia.

4. The control unit as described in claim 3, wherein the case being in the second position it can be laterally translated towards a third position, so as to be distant, parallel, and just facing the fascia, the hook sliding along the spindle in the first slot until it is level with the second slot.

5. The control unit as described in claim 4, wherein the second slot has a width greater than the width of the hook so that the control unit being in the third position, the hook can be disengaged from the spindle and the case translated and brought towards the fascia, the hook sliding in the second slot, until the case and the fascia are in contact one with the other, the control unit then being in the closed state.

6. The control unit as described claim 1, wherein the integrated device for assisting assembly comprises two hinges, each hinge having a spindle and an arm terminated in a hook, the two spindles being coaxial so as to form a long guidance.

7. The control unit as described in claim 1, wherein the first device is a printed circuit and the second device a sensor comprising a flexible film having a detection zone connected to the printed circuit by a long and narrow flexible tongue.

8. The control unit as described in claim 1, wherein the connection link comprises an optical fibers.

* * * * *